United States Patent
Koshiba

Patent Number: 5,325,316
Date of Patent: Jun. 28, 1994

[54] COMPRESSION PROCESSING METHOD OF REAL NUMBER DATA IN PROCESSING SYSTEM AND APPARATUS THEREFOR

[75] Inventor: Minoru Koshiba, Yokohama, Japan

[73] Assignee: Fujitsu Limited, Kawasaki, Japan

[21] Appl. No.: 136,410

[22] Filed: Oct. 15, 1993

Related U.S. Application Data

[63] Continuation of Ser. No. 983,272, Nov. 30, 1992, abandoned, which is a continuation of Ser. No. 773,449, Oct. 9, 1991, abandoned.

[30] Foreign Application Priority Data

Oct. 11, 1990 [JP] Japan .................... 2-273085

[51] Int. Cl.$^5$ .............................. G06F 7/38
[52] U.S. Cl. .................. 364/715.02; 364/715.03; 364/715.04; 364/745
[58] Field of Search ............ 364/715.01, 715.02, 364/715.03, 715.04, 745, 749; 382/56; 395/164; 341/67, 95

[56] References Cited

U.S. PATENT DOCUMENTS 4,367,536  1/1983  Vignes et al. ............... 364/745
5,016,009  5/1991  Whiting et al. .............. 341/67

FOREIGN PATENT DOCUMENTS 55-110343  8/1980  Japan .
58-58682   4/1983  Japan .
63-48068   2/1988  Japan .
63-204473  8/1988  Japan .
63-258189 10/1988  Japan .

Primary Examiner—Long T. Nguyen
Assistant Examiner—Chuong D. Ngo
Attorney, Agent, or Firm—Staas & Halsey

[57] ABSTRACT

A data compression processor including a first memory for storing real number data used for processing and a data compression processor for compressing the real number data read out from the first memory. The data compression processor compresses the digits of the real number data. The invention provides not only a processor which can efficiently execute processing in all fields without increasing the capacity of a memory used for processing, but can also improve the accuracy of data as a result of processing.

9 Claims, 8 Drawing Sheets

| Fig. 7 | | |
|---|---|---|
| Fig. 7A | Fig. 7B | Fig. 7C |

[MAP DRAWING]

~70

MEMORY

LINE DATA ~71
 (132.5, 67.1)-(849.4, 67.1)

LINE DATA
 ⋮

73 STORING

COMPRESSION PROCESS
77

COMPRESSING DATA FROM 15 DIGIT TO 10 DIGIT
(UPPER LIMIT DIGIT=4)

132.500000000000 ⇒ 0132500000
67.1000000000000 ⇒ 0067100000      } 75
849.400000000000 ⇒ 0849400000
67.1000000000000 ⇒ 0067100000

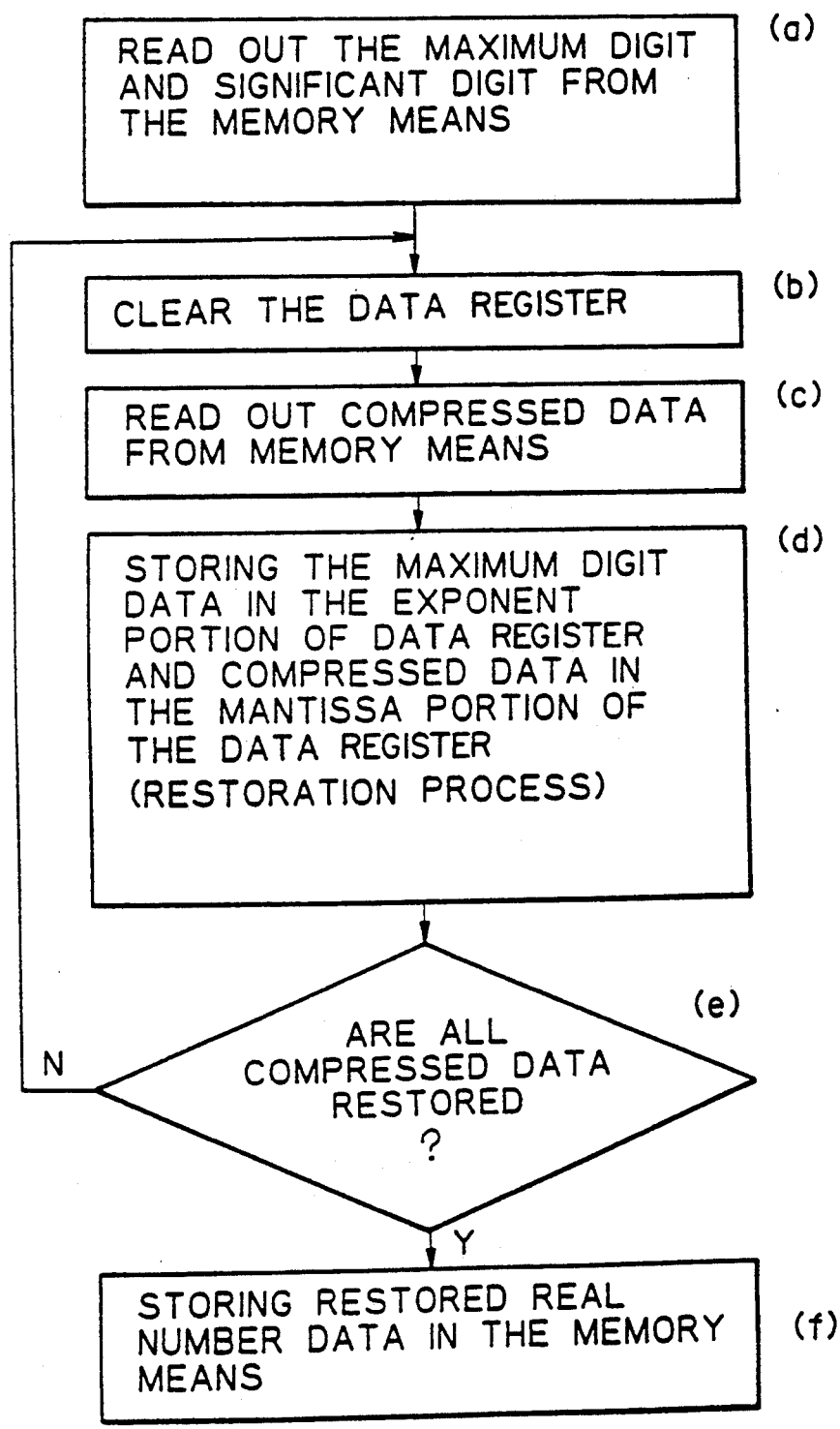

COMPRESSION PROCESSING METHOD OF REAL NUMBER DATA IN PROCESSING SYSTEM AND APPARATUS THEREFOR

This application is a continuation of application Ser. No. 07/983,272, filed Nov. 30, 1992, now abandoned, and which is a continuation of Ser. No. 07/773,449, filed Oct. 9, 1991, now abandoned.

BACKGROUND OF THE INVENTION

1. Field of the Invention

This invention relates to a compression processing method of real number data in a processing system and apparatus therefor. More particularly, the present invention relates to a real number data compression processing method and apparatus capable of reducing a memory capacity necessary for processing and preserving real number data.

2. Description of the Related Art

A processing system for executing various processings by the use of real number data has been used in many fields.

The problem with such a processing system is the extent to which the significant digits of the real number data to be handled should be guaranteed, and 15 digits and 64 bits are ordinarily guaranteed at present.

This results from the fact that the digits of the processed data are generally 15 digits when various processings are executed in a memory as a memory means used in the processing system.

When the data after processing are stored and preserved in a suitable medium such as a tape or a disc, however, the data need not always be guaranteed accurate throughout the fifteen digits and in some cases, it will be sufficient if accuracy is guaranteed for ten digits.

Therefore, when the data are preserved, compression processing, which rounds down or cuts off the data to a suitable digit and compresses the real number data, has been carried out.

On the other hand, the data are different from system to system in accordance with the field in which the processing system is employed, and quite naturally, the significant digits of the data are different in accordance with the field in which they are dealt with.

In a processing system associated with daily accounting, for example, the order of the real number data handled is $10^0$ or more but in the field of design requiring ultra-high accuracy such as in an LSI design, the order of the real number data is from to $10^{-9}$ to $10^0$.

Furthermore, the real number data in processing in the field of architectural design are in the order of $10^{-3}$ to $10^2$.

In other words, it is very important in such a processing system to which position of the order the significant digit should be set because the real number data to be dealt with by the system vary even though a hardware used remains the same. Therefore, softwares have conventionally been so designed as to recognize the data value in the order of to $10^{-9}$ to $10^{+2}$, for example, as the significant digit so that processing can be executed in various fields by the use of the same processing system.

In accordance with the conventional system, however, the significant digit of the real number data has been equally rounded down to a predetermined digit. For example, the real number data used for all the processings are limited to 10 digits from the most significant digit and the data of the other digits are all cut off.

As described above, the significant digit of the real number data used in the processing system varies with the field in which the system is used. Even though no problem is encountered when the real number data up to the tenth digit from the most significant digit are used for the real number data in processing the architectural design, such a method is not sufficient and an accurate design cannot be made in the case of an LSI design when the fifth to fifteenth digits from the most significant digit are used as the significant digits.

When a drawing such as a map is depicted and displayed by the use of a CAD system, the real number data in the order of at most 6 digits are used; hence, it is not necessary to secure ten digits as the significant digits and this is a so-called "over-specification" state.

One of the methods of solving these problems is to change the memory capacity in accordance with the significant digits of the real number data required in the respective fields, but such a method is not an economical processing system because the memory capacity becomes great.

SUMMARY OF THE INVENTION

The present invention is directed to provide an economical processor which can solve the problems of the prior art described above, can reliably grasp the significant digits of the real number data used during processing, execute data compression processing without increasing memory capacity used in a processing system and yield an accurate processing result suitable for an intended application.

The compression processor of the real number data in the processing system in the present invention employs the following fundamental technical construction in order to accomplish the objects described above.

Namely, in a processor comprising a first memory means for storing real number data used for processing and data compression processing means for compressing the real number data read out from the memory means, connected to the memory means, the processor of the invention is characterized in that the data compression processing means is a real number data compression processor having the function of compressing the digit of the real number data. More specifically, it is a real number data compression processor comprising a third memory means for temporarily storing the real number data read out from the first memory means; digit designation means for designating the maximum digit of the real number data to be compressed; upper limit digit designation means for designating the significant upper limit digit counted from the point of the real number data; normalization means for normalizing the real number data stored in the third memory means on the basis of the information from the upper limit digit designation means; a data register for storing the real number data compression-processed; and data compression means connected to the data register, for compression-processing the normalized real number data on the basis of the information stored in the upper limit digit designation means and in the digit designation means.

The real number data compression processor of the present invention is based on the finding that the significant digits of about 10 digits will be sufficient for the LSI design and architectural designs are individually taken into consideration in accordance with the applications, and is also based on the fact that the position on the real number data grasping the significant digits changes in accordance with the applications. Whereas the digit cut-out position is stationary in the prior art systems, the cut-out position of the significant digits are variable in the present invention in accordance with the applications so that the digits of the real number data can be compressed and data compression can be thus executed.

For the reasons described above, the present invention can drastically reduce the capacity of the memory necessary for storing the data of processing and processing results.

BRIEF DESCRIPTION OF THE DRAWINGS

FIGS. 7, 7A, 7B and 7C are an explanatory view explaining an embodiment of a real number data compression processing method in accordance with the present invention; and FIGS. 8 and 9 are flowcharts explaining a real number data compression processing method in the present invention.

DESCRIPTION OF THE PREFERRED EMBODIMENT

Hereinafter, a method and apparatus for compression-processing real number data in a processing system in the present invention will be explained in detail with reference to the accompanying drawings.

Figure 1:
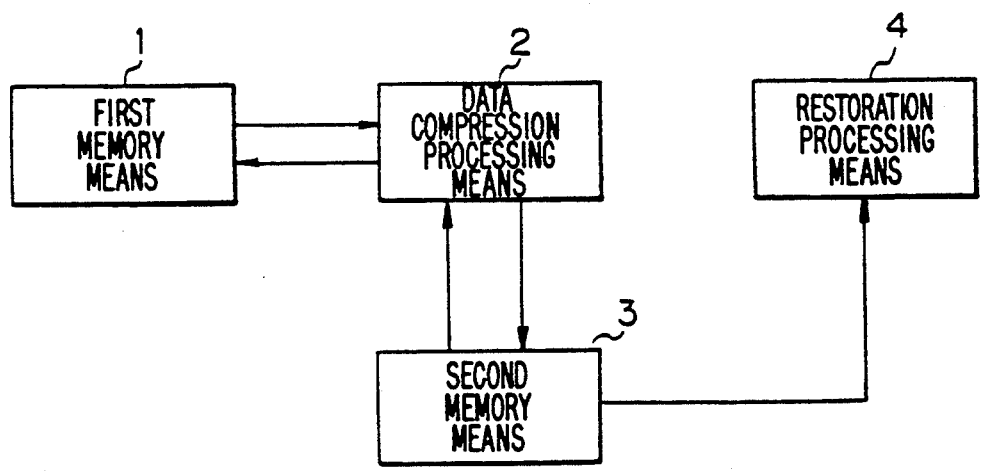
FIG. 1 is a block diagram useful for explaining the outline of a real number data compression processor in accordance with the present invention.

FIG. 1 is a block diagram showing the fundamental principle of an apparatus for compression-processing real number data in a processing system in the present invention. The apparatus comprises a first memory means 1 for storing real number data used for processing, data compression processing means 2 for compressing the digit of the real number data read out from the memory means 1, connected to the first memory means 1, and second memory means 3 for storing the real number data compressed by the data compression processing means 2.

In the real number data compression processor in the processing system of the present invention, a restoration processing means 4 for taking out the compressed real number data and restoring it to the original real number data is also provided, whenever necessary.

The real number data used for predetermined processing are stored in the first memory means 1, and the memory format of the real number data stored in this memory means 1 is not particularly limited. Therefore, known formats can be used.

Figure 2:
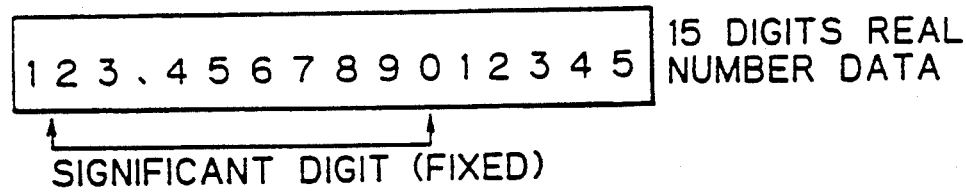
FIGS. 2 and 3 are explanatory views for explaining the handling method of the real number data used in the present invention.

For example, the real number data may be stored in the format such as shown in FIG. 2 in the first memory means 1.

In the format shown in FIG. 2, the data is displayed in 15 digits using 64 bits, as already described.

Figure 3:
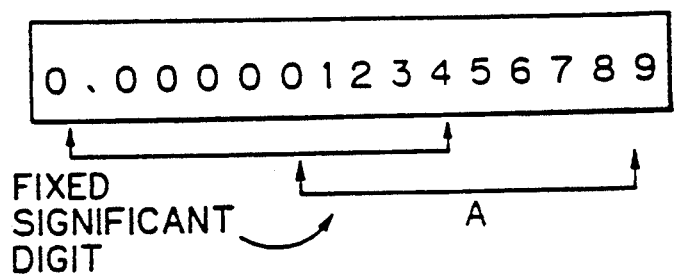

In the real number data using the data format of such a system, the significant digit setting system of a fixed type by the conventional method employs 10 digits from the most significant digit and cuts off the other digits. Although no problem occurs in the case of the real number data shown in FIG. 2, this fixed type system cannot sufficiently grasp the significant digits when the real number data have a structure such as shown in FIG. 3. Therefore, the positions of the digits to be employed as the significant digits must be shifted to the positions A shown in FIG. 3.

Figure 4:
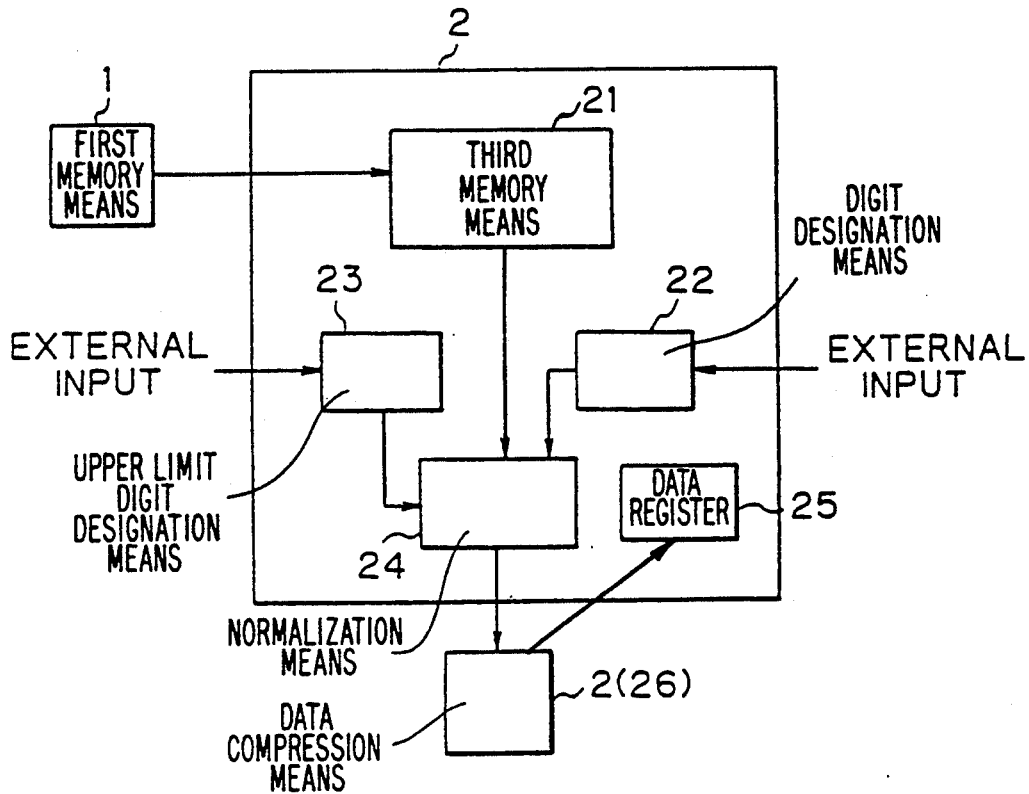
FIG. 4 is an explanatory view explaining the construction of data compression processing means in the present invention.

In order to accomplish the technical concept described above, therefore, the present invention employs a structure for data compression processing 2 such as shown in FIG. 4.

In other words, the data compression processing means 2 is provided with a third memory means 21 for temporarily storing the real number data read out from the first memory means 1, digit designation means 22 for designating the maximum digit of the real number data to be compressed, upper limit digit designation means 23 for designating the significant upper limit digit counted from the decimal point of the real number data, normalization means 24 for normalizing the real number data stored in the third memory means 21 on the basis of the data from the upper limit digit designation means 23, a data register 25 for storing the compressed real number data, and data compression means 26 connected to the data register 25, for compressing the normalized real number data on the basis of the data stored in the upper limit designation means 23 and in the digit designation means 22.

In the compression processor of the real number data of the present invention, the digit of the data to be compressed is set by using the data of the digit designation means 22 and the upper limit digit designation means 23 at the same time, from which digits of the real number data used as the significant digits are decided by the data of these means 22, 23. Each of the real number data is then compressed.

Now, referring to FIGS. 4 and 5 the fundamental principle of the data compression processing in the present invention will be explained. The data compression means processes the normalized real number data on the basis of the data stored in the upper limit digit designation means 23 and in the digit designation means 22, stores the data of the designated upper limit digit in the characteristic area 55 of the data register 25 and stores the data of the significant digits corresponding to the designated digits from the normalized real number data in accordance with the designated digit data after compression in the data of the significant digits corresponding to the designated digits from the normalized real number data in the fixed-point part area 54 of the data register in accordance with the designated digit data after compression.

The digit designation means 22 and the upper limit digit designation means 23 may constitute a table inclusive of a memory circuit, and its data are appropriately input by an external input means.

Since the digit designation means 22 stores the data for designating the digit of the real number data after compression, for example, a suitable numeric value is selected from 5 to 15 digits and is input.

On the other hand, the upper limit digit designation means 23 anticipates in advance the maximum value of the real number data to be processed or determines its maximum value by checking all the real number data stored in the first memory means 1, and a value representing the digit of the real number data from the point is input.

Assuming, for example, that a data having a maximum value in order of $10^4$ among all the real number data exists in the real number data shown in FIG. 2, the value "4" is input to the upper limit digit designation means 23.

In FIG. 3, a value "−7" is input.

In other words, the data of the upper limit digit designation means 23 represents by what digits the maximum value of the significant digits in the real number data is spaced apart from the decimal point, and the data is used to decide from where the significant digits are to be cut off, as will be described elsewhere.

In the manner described above, the segmentation position of the significant digit segmented from the real number data in accordance with the upper limit digit designation means 23 made variable with the intended applications and compression of the digits of the data is carried out by the use of the data of the digit designation means 22.

Figure 5:
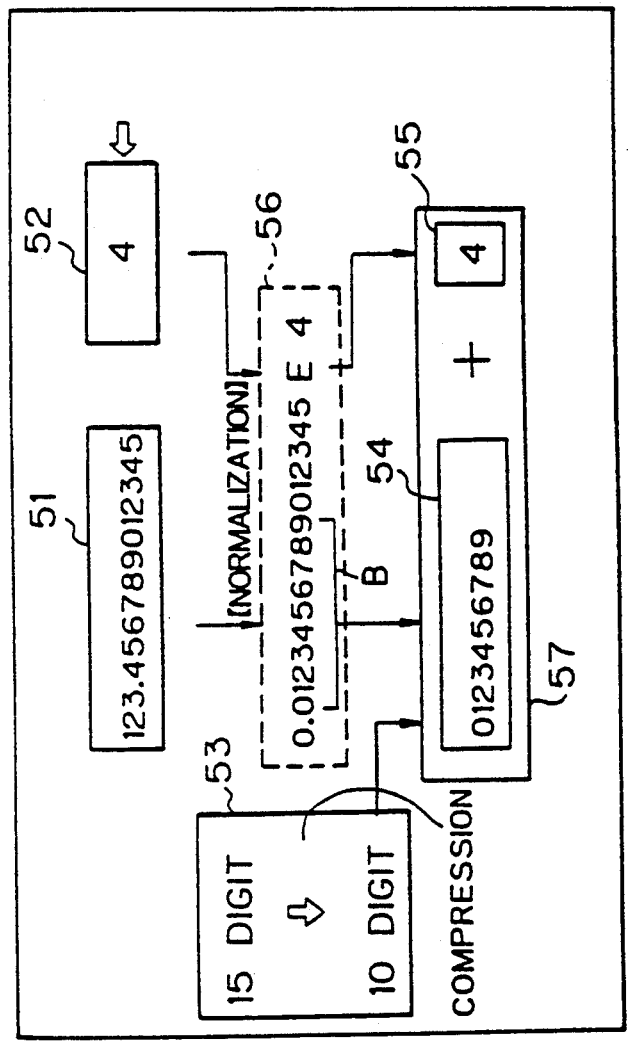
FIG. 5 is an explanatory view explaining the principle of data compression of a real number data compression processing method in accordance with the present invention.
Figure 5:
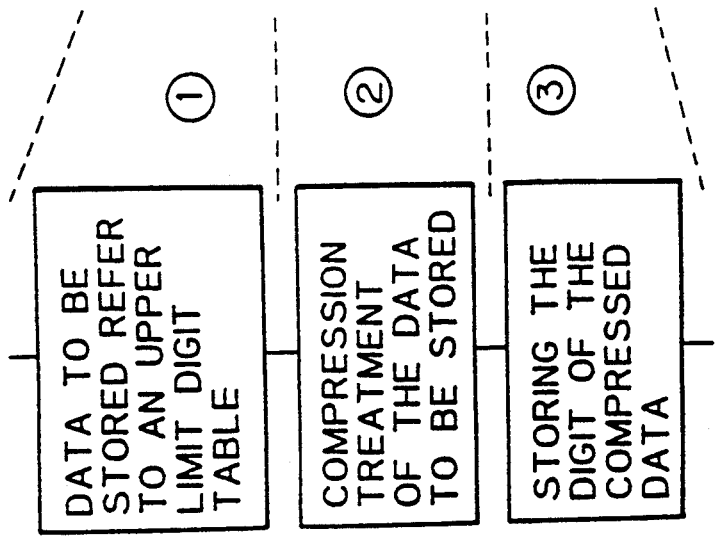
Figure 7A:
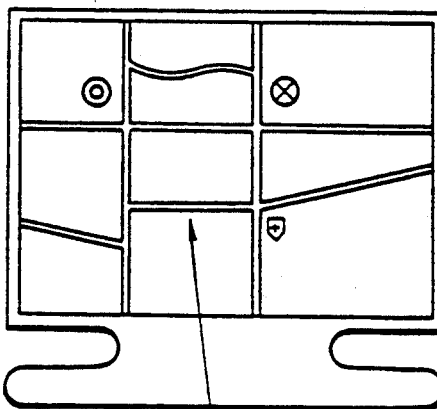
Figure 7A:
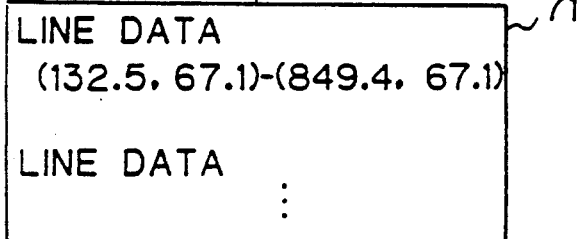
Figure 7B:
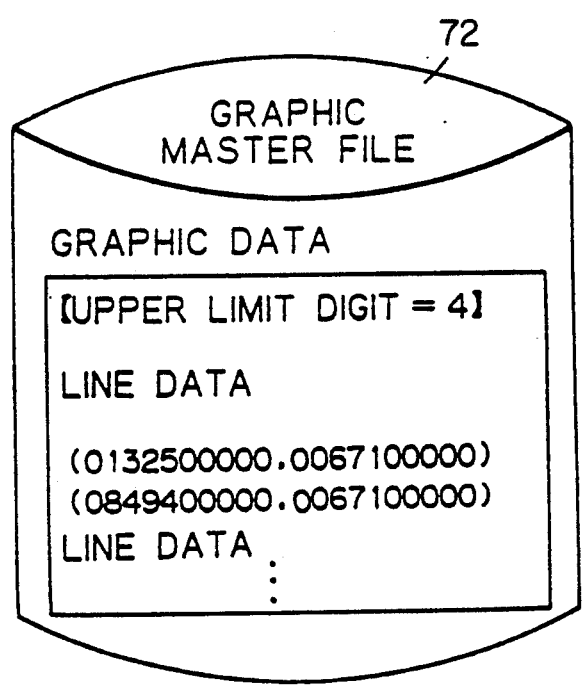
Figure 7C:
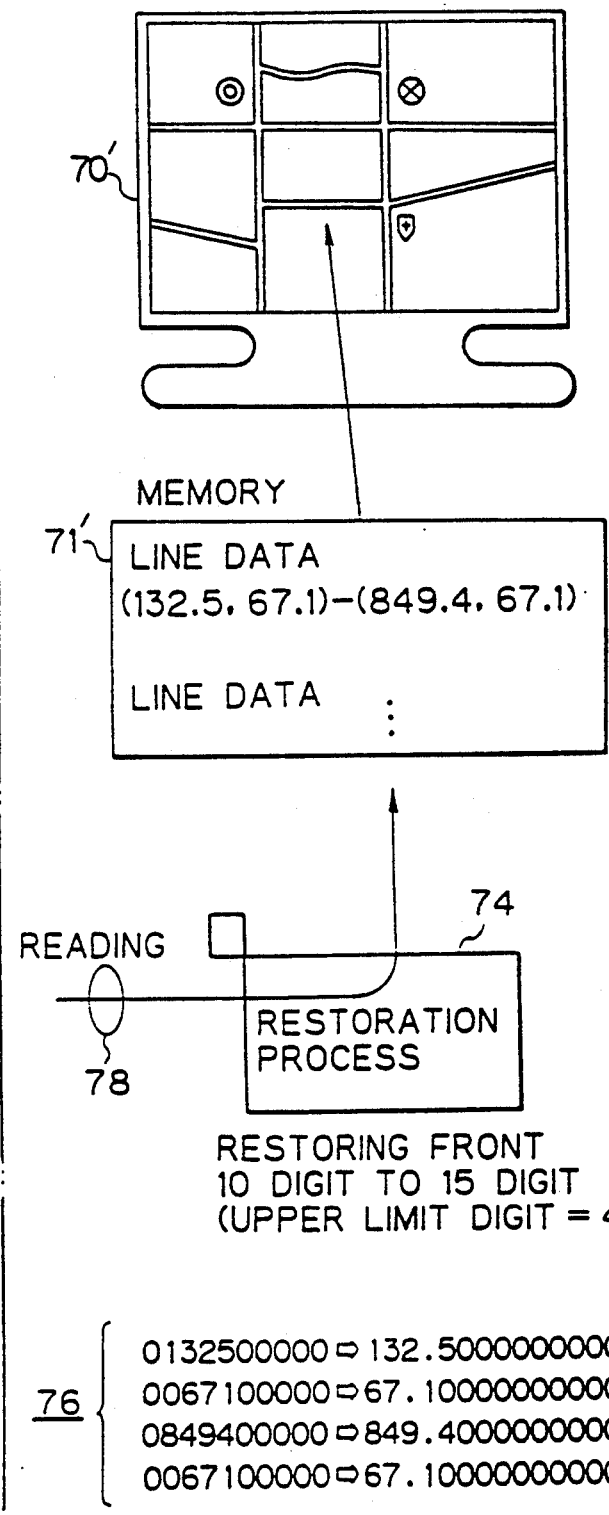

FIG. 5 shows a definite example of the application of the real number data compression method in the processing system of the present invention to a system for displaying a CAD screen on display means so as to process coordinates of position data of a drawing or a map and to display the data on a display.

FIG. 5 shows the data compression processing means 2 including a graphic master file in the system described above. The left-hand portion of the drawing shows a processing flow and the right-hand portion does the modes of processing corresponding to the processing flow. Reference numeral 51 denotes a memory for storing the coordinates data read out from the first memory means and this memory corresponds to the third memory means. Reference numeral 52 denotes an upper limit digit table for holding the upper limit digit designated from outside, and this corresponds to the upper limit digit designation means 23 shown in FIG. 4. Reference numeral 53 denotes a digit compression indication portion and this corresponds to the digit designation means 22 in FIG. 4. Reference numerals 54 and 55 denote a fixed-point part (mantissa portion) and a characteristic part (exponent portion) for storing the data on the graphic master file in the data register 57, respectively.

The system operation will be explained while keeping the correspondence to the processing flow shown in the drawing.

At processing step ①, assuming that the coordinates data on the display memory has 15 digits given by "123.456789012345" as shown in the drawing, the information indicating that the most significant digit in a given application field is 4 is provided from outside. (In other words, the information indicating that the digits above the decimal point is maximum "4" is provided, though this value varies with the application field). This designated value is stored in the upper limit digit table 52 as the digit designation means.

At step ②, assuming, for example, that the information indicating that the significant digit is 10 when a compressed digit of the data is given; then, this value is set to the digit compression designation portion 53.

Next, in the present invention, the real number data is normalized by using the data stored in the digit designation means 22 and in the upper limit digit designation means 23.

This normalization is so effected that "0" is disposed at the leading position, followed then by the numerals "0 1 2 3 . . . " and finally, a symbol "E4" is positioned, as denoted by reference numeral 56 in FIG. 5.

The method of normalization is not limited to the above, and known methods can be employed, as well.

In the normalized data in the present invention described above, "0" at the leading position is merely formal and subsequent "0 1 2 3 4 5 6 7 8 9 0 1 2 3 4 5 E 4" are significant.

The reason why the arrangement "0 1 2 3 4 5 . . . " is used is as follows. Since the maximum digit of all the real number data to be processed is $10^4$, the digits above the point are 4, and this value is stored in the upper limit designation means 23.

However, since the most significant digit of the real number data to be handled at present is 3, the fourth digit is set to 0.

In other words, in the normalized data in the present invention, the numeral appearing next to "0" represents the maximum digit position of all the real number data to be processed, and the significant digit is also set by using this position as the reference.

The symbol "E4" at the end of this normalization means that the maximum digit of the real number data is 4. It is possible to know at which position the decimal point of the real number data exists by referring to this information.

In the present invention, the real number data thus normalized are stored in the tables in the fixed-point part area 54 and characteristics part area 55 of the data register 57, respectively.

Next, the normalized real number data are compressed in the present invention. The data compression is carried out using the data stored in the digit designation means 22 described above. Since ten digits are designated in this embodiment, the ten digits from the digit corresponding to the most significant digit or in other words, the numeric value represented by B in FIG. 5, among the normalized real number data are judged as the significant digits and are stored in the table 54 of the data register 57.

The other numeric values are rounded down.

In the data E4 disposed at the last position of the normalized real number data, the numeric value "4", that is, the information stored in the upper limit digit designation means, is stored in the table 55 of the data register 57.

When such processing is executed, the real number data read out from the first memory means are compressed to the 10-digit real number data.

However, it is possible to know from the information "4" stored in the table 55 of the characteristics part area, that the compressed data is the data that contains the most significant digit, i.e., "0", of the compressed real number data at the fourth digit.

The real number data to be handled in this embodiment is the data exceeding the point. Therefore, the information stored in the upper limit digit designation means 23 is a positive integer. When the real number data is as shown in FIG. 3, however, the information stored in the upper limit digit designation means 23 becomes a negative integer.

In the present invention, such data compression processing is executed for all the real number data and the result is stored in a suitable memory means, that is, the second memory means.

The second memory means may be disposed separately from the first memory means, or may be disposed inside the first memory means.

In the present invention, it is possible to restore the real number data, the digits of which are compressed and stored in the second memory means, to the original real number data by the use of a suitable restoration means, and to display the data on a CAD display, or the like.

Figure 6:
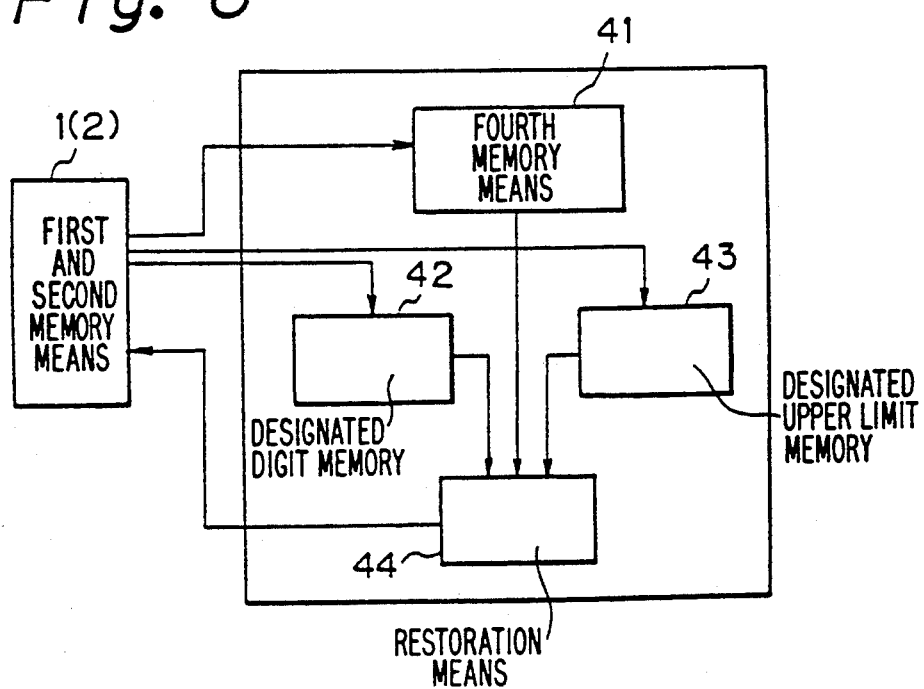
FIG. 6 is an explanatory view explaining restoration processing means used in the present invention.

As shown in FIG. 6, the restoration means 4 preferably comprises a fourth memory means 41 for temporarily storing the compressed real number data read out from the second memory means 2; a designated digit memory means 42 for storing the information designated by the digit designation means 22, a designated upper limit digit memory means 43 for storing the information designated by the upper limit digit designation means 23, and a restoration means 44 for restoring the compressed real number data stored in the fourth memory means 41, using the information of the designated digit memory means 42 and the designated upper limit digit memory means 43. The restored real data is stored in the first memory means.

FIG. 7 shows another embodiment of the real number data compression method in the processing system in accordance with the present invention.

In the drawing, reference numerals 70 and 70' denote displays; 71 and 71' are display memories; 72 is a graphic master file; 73 is a compression processing portion; 74 is a restoring processing portion; 75 is data at the time of compression; 76 is data at the time of restoration; 77 is a storage processing portion; and 78 is a readout processing portion.

When a map drawing is prepared, for example, a map is displayed on the display 70 and map data are gradually decided. As a result, as coordinates position data corresponding to a certain line, the line is stored in the display memory 71 as having a start point given by (132.5, 67.1)

and an end point given by (849.4, 67.1).

When the coordinates position data are stored in the graphic master file 72, 15 digits are compressed to 10 digits and the upper limit digit "4" is then indicated. The compression processing portion 73 acquires the data 75 at the time of compression as shown in the drawing. This result is stored with the upper limit digit "4" in the graphic master file 72 as the line data (0132500000,0067100000 -
(0849400000,0067100000).

When the map is referred to, the graphic data are read out from the graphic master file 72 and are restored in the restoration processing portion 74. In other words, the data 76 at the time of restoration shown in the drawing can be obtained.

The data 76 at the time of restoration are transcribed to the display memory 71' and are displayed on the display 70'.

Figure 8:
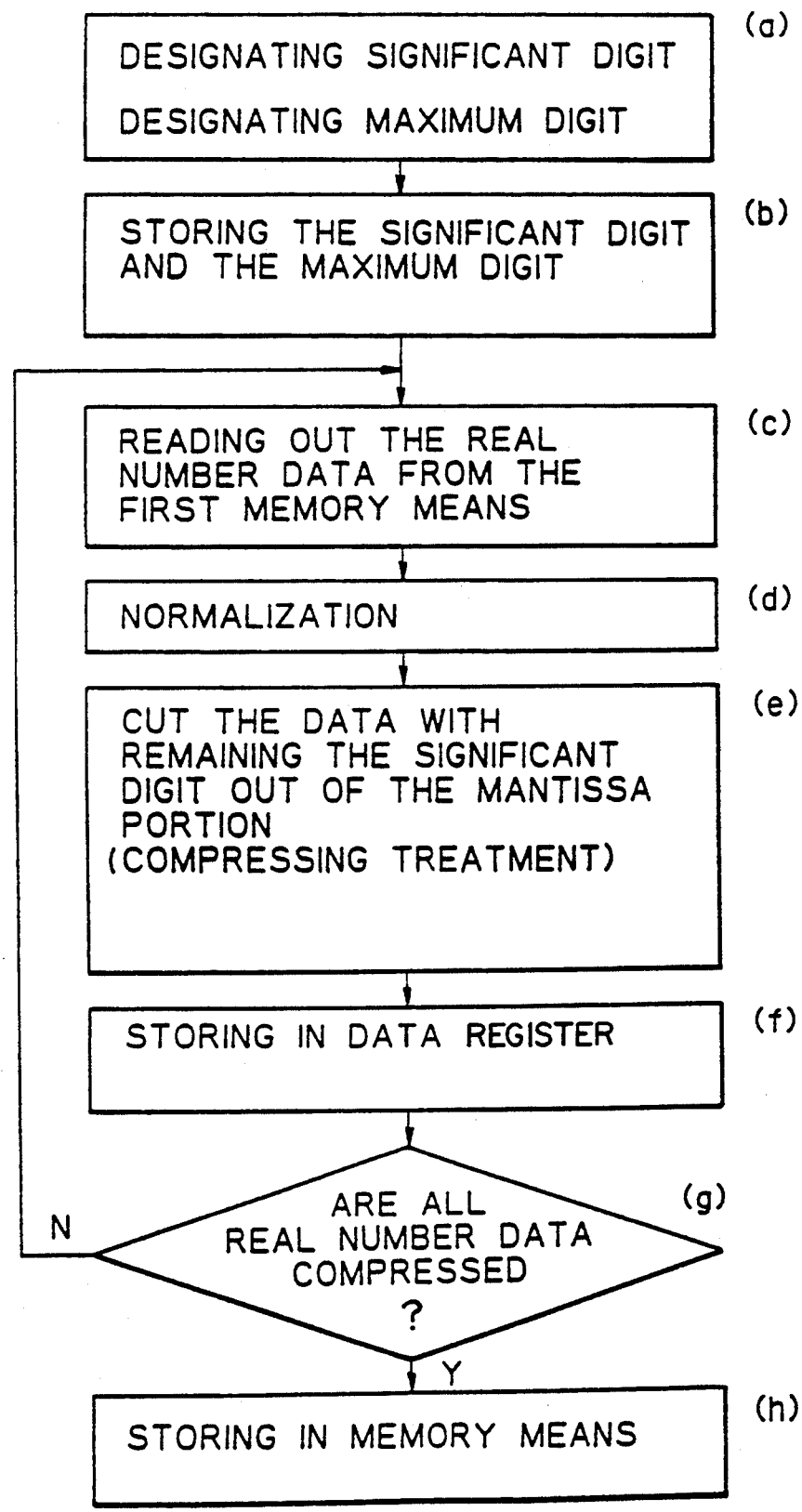

FIGS. 8 and 9 show the flowcharts of the compression processing method of the real number data in accordance with the present invention.

In other words, the compression processing method of the real number data in the present invention comprises:

a step of designating the significant upper limit digit counted from the point of the real number data to be compressed and a step of designating the maximum digit of the real number data to be compressed (step (a));

a step of storing the designated significant upper limit digit and maximum digit in a suitable memory means of the compression processing means (step (b));

a step of reading out the real number data to be processed from the first memory means (step (c));

a step of normalizing the real number data thus read out by the use of the information of the designated upper limit digit (step (d));

a step of processing the normalized real number data at the data compression step on the basis of the information stored in the upper limit designation means and in the digit designation means, storing the information of the designated upper limit digit in a characteristics part area of a data register, storing the data of the significant digits corresponding to the designated digits from the normalized real number data in a fixed-point part area (mantissa portion) of the data register in accordance with the designated digit information after compressing, and thus executing a data compression processing (step (e));

a step of storing the real number data subjected to compression processing, the designated upper limit digit information and the designated digit information after compression in a data register (step (f)); and a step of judging whether or not all the real number data are compression processed, repeating each of the steps described by returning to step (c) if the result of judgment proves NO and storing all the compressed data in the second memory means if the result proves YES (step (h)).

As shown in the flowchart of FIG. 9, on the other hand, the restoration processing method in the present invention comprises:

a step of reading out the designated upper limit digit information and the designated digit information after compression, that are stored in the first or second memory means, to the compressed data restoration means (step (a));

a step of clearing the content of the data register (step (b));

a step of reading out the compressed real number data stored in the second memory means from the memory means to the compressed data restoration processing means (step (c));

a step of storing the individual compressed real number data, which are thus read out, in the fixed-point part area of the data register and at the same time, storing the designated upper limit digit information in the characteristics part area of the data register and restoring them to the original real number data (step (d)); and a step of judging whether or not all the compressed real number data are restored, repeating each of the steps described above if the result of judgment proves NO by returning to the step (b), and storing all the restored data in the first or second memory means if the result of judgment proves YES (step (f)).

The present invention not only provides a processor capable of accurate processings in all the fields without increasing the capacity of the memory used for the processing, but can also improve the accuracy of the processed data.

In accordance with the present invention, since the real number data compression processor has the technical construction as explained above, the value of the significant digit which is precisely required in the field in which they are dealt with, can be accurately stored by setting an upper limit digit.

And further, when the compressed data is stored in a master file 12 for drawing or the like, the digit of the compressed data can be selectively designated.

We claim:

1. A real number data compression processor comprising:
    first memory means for storing real number data;
    data compression processing means, connected to said first memory means, for compressing digits in said real number data read out from said first memory means thereby generating compressed real number data, said data compression processing means including:
        third memory means for temporarily storing said real number data read out from said first memory means;
        digit designation means for designating a number of compression digits;
        upper limit digit designation means for designating a maximum number of significant upper limit digits counted from a decimal point of said real number data;
        normalization means, connected to said third memory means and said upper limit digit designation means, for normalizing said real number data stored in said third memory means based on said designated maximum number of significant upper limit digits;
        data compression means, connected to said normalization means and said digit designation means, for compressing said normalized real number data based on said designated number of compression digits, thereby generating said compressed real number data; and
        a data register, connected to said data compressing means, which stores said compressed normalized real number data and said designated maximum number of significant digits.

2. A data compression processor according to claim 1, further comprising second memory means for storing said compressed real number data compressed by said data compression processing means.

3. A real number data compression processor according to claim 2, wherein said second memory means stores said compressed real number data, said designated maximum number of significant upper limit digits and said designated number of compression digits.

4. A real number data compression processor according to claim 3, wherein said second memory means is disposed inside said first memory means.

5. A real number data compression processor according to claim 1, wherein said data register stores said compressed normalized real number data in a characteristics part area of said data register, and stores said designated maximum number of significant digits in a fixed-point part area of said data register.

6. A real number data compression processor according to claim 1, further comprising data restoration means for restoring said compressed real number data into said real number data.

7. A real number data compression processor according to claim 1, further comprising second memory means for storing said compressed real number data and data restoration means for restoring said compressed real number data into said real number data, said data restoration means comprising:
    fourth memory means for temporarily storing said compressed real number data read out from said second memory means;
    designated digit memory means for storing said number of compression digits;
    designated upper limit digit memory means for storing said maximum number of significant upper limit digits; and
    restoration means for restoring said compressed real number data stored in said fourth memory means based on data stored in said designated digit memory means and said designated upper limit digit memory means.

8. A real number data compression processing method using first memory means for storing real number data, data compression means for compressing said real number data read out from said first memory means, and second memory means for storing said compressed real number data, said method comprising the steps of:
    designating a maximum number of significant upper limit digits counted from a decimal point of said real number data stored in said first memory means;
    designating a number of compression digits;
    storing said designated maximum number of significant upper limit digits and said number of compression digits in third memory means;
    reading out said real number data from said first memory means;
    normalizing said read-out real number data based on said designated maximum number of significant upper limit digits;
    compressing said normalized real number data based on said designated number of compression digits, thereby generating said compressed real number data;
    storing said designated maximum number of significant digits in a fixed-point part of a data register;
    storing said compressed normalized real number data in a characteristics part of said data register; and
    storing said compressed real number data, said designated maximum number of significant upper limit digits and said designated number of compression digits in said second memory means.

9. A real number data compression processing method according to claim 8, further comprising the steps of:
    reading out said designated maximum number of significant upper limit digits and said designated number of compression digits stored in said second memory means;
    reading out said compressed real number data stored in said second memory means;
    restoring said compressed real number data into said real number data based on said designated maximum number of significant upper limit digits and said number of compression digits read-out from second memory means; and
    storing said restored real number data in said first memory means.

* * * * *

UNITED STATES PATENT AND TRADEMARK OFFICE
CERTIFICATE OF CORRECTION

PATENT NO. : 5,325,316
DATED : June 28, 1994
INVENTOR(S) : Minoru Koshiba

It is certified that error appears in the above-indentified patent and that said Letters Patent is hereby corrected as shown below:

Column 1

Line 61, "$10^{+2}$" should be --$10^{-2}$--.

Signed and Sealed this

Eleventh Day of April, 1995

*Attest:*

BRUCE LEHMAN

*Attesting Officer*      *Commissioner of Patents and Trademarks*